US008650002B2

(12) United States Patent
Choi et al.

(10) Patent No.: US 8,650,002 B2
(45) Date of Patent: Feb. 11, 2014

(54) DETERMINING PLASMA PROCESSING SYSTEM READINESS WITHOUT GENERATING PLASMA

(75) Inventors: Brian Choi, Fremont, CA (US); Gunsu Yun, Fremont, CA (US); Vijayakumar C. Venugopal, Berkeley, CA (US); Norman Williams, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 685 days.

(21) Appl. No.: 12/499,696

(22) Filed: Jul. 8, 2009

(65) Prior Publication Data

US 2010/0332168 A1 Dec. 30, 2010

Related U.S. Application Data

(60) Provisional application No. 61/222,026, filed on Jun. 30, 2009.

(51) Int. Cl.
*B23Q 17/00* (2006.01)
*G06F 17/40* (2006.01)
*G06F 19/00* (2011.01)

(52) U.S. Cl.
USPC .............. 702/182; 73/865.9; 75/375; 438/17; 702/1; 702/34; 702/127; 702/183; 702/184; 702/185; 702/187

(58) Field of Classification Search
USPC ......... 702/65–74, 82, 84, 116–123, 182–189, 702/1, 33, 34, 57, 64, 81, 108, 127; 73/432.1, 865.8, 865.9, 866.3; 75/10.1, 75/10.19, 330, 375; 438/5, 10, 14, 17; 700/1, 11, 21, 79, 80, 81, 90; 703/2, 6, 703/7; 708/100, 105, 200
IPC B23K 9/00,9/095, 9/0953, 10/00, 10/02; B23Q 17/00,17/007, 17/008, 2017/00, 2717/00; G01D 7/00, 9/00, 21/00; G06F 11/00, 11/30, 11/32, G06F 11/34, 17/00, 17/40, 19/00; H01J 37/00, H01J 37/32, 37/32917, 37/32926, 37/32935
See application file for complete search history.

(56) References Cited

U.S. PATENT DOCUMENTS 2,883,255 A * 4/1959 Anderson .................... 346/34
3,321,613 A * 5/1967 Searle ......................... 702/182

(Continued)

FOREIGN PATENT DOCUMENTS

| JP | 2008/016517 A | 1/2008 |
| KR | 10-2007-0033767 A | 3/2007 |
| WO | WO-2008/002938 A2 | 1/2008 |

OTHER PUBLICATIONS

"International Search Report", Issued in PCT Application No. PCT/US2010/037936; Mailing Date: Jan. 4, 2011.

(Continued)

*Primary Examiner* — Edward Cosimano

(57) ABSTRACT

A test system for facilitating determining whether a plasma processing system (which includes a plasma processing chamber) is ready for processing wafers. The test system may include a computer-readable medium storing at least a test program. The test program may include code for receiving electric parameter values derived from signals detected by at least one sensor when no plasma is present in the plasma processing chamber. The test program may also include code for generating electric model parameter values using the electric parameter values and a mathematical model. The test program may also include code for comparing the electric model parameter values with baseline model parameter value information. The test program may also include code for determining readiness of the plasma processing system based on the comparison. The test system may also include circuit hardware for performing one or more tasks associated with the test program.

17 Claims, 4 Drawing Sheets

(56) References Cited

U.S. PATENT DOCUMENTS

| | | | |
|---|---|---|---|
| 6,825,050 B2 * | 11/2004 | Huang et al. | 438/5 |
| 2003/0226821 A1 * | 12/2003 | Huang et al. | 216/59 |
| 2005/0199602 A1 * | 9/2005 | Kaddani et al. | 219/130.21 |
| 2007/0162172 A1 | 7/2007 | Tanaka et al. | |
| 2007/0284246 A1 | 12/2007 | Keil et al. | |

OTHER PUBLICATIONS

"Written Opinion", Issued in PCT Application No. PCT/US2010/037936; Mailing Date: Jan. 4, 2011.

"International Preliminary Report or Patentability", PCT Application No. PCT/US2010/037936, Mailing Date: Jan. 12, 2012.

* cited by examiner

DETERMINING PLASMA PROCESSING SYSTEM READINESS WITHOUT GENERATING PLASMA

CROSS REFERENCE TO RELATED APPLICATION

The present invention claims priority under 35 U.S.C. 119 (e) to a commonly owned provisionally filed patent application entitled "DETERMINING PLASMA PROCESSING SYSTEM READINESS WITHOUT GENERATING PLASMA," U.S. Application No. 61/222,026, filed on Jun. 30, 2009, by inventors Brian Choi, Gunsu Yun, Vijayakumar C Venugopal, and Norman Williams, now expired all of which is incorporated herein by reference.

BACKGROUND OF THE INVENTION

The present invention is related to plasma processing systems. In particular, the present invention is related to determining whether a plasma processing system is ready for performing plasma processing.

Plasma processing systems, such as capacitively coupled plasma (CCP) systems, inductively coupled plasma (ICP) systems, and transformer coupled plasma (TCP) systems, are employed in various industries for fabricating devices on wafers. For example, the industries may include semiconductor, magnetic read/write and storage, optical system, and micro-electromechanical system (MEMS) industries. A plasma processing system may generate and sustain plasma in a plasma processing chamber to perform etching and/or deposition on a wafer such that device features may be formed on the wafer.

In general, changes in the plasma processing chamber caused by, for example, consumption of consumable materials, deformation of components, replacement of parts, etc., may negatively affect the performance of the plasma processing system in processing wafers. For example, if the wafers are processed under an inappropriate, suboptimal condition of the plasma processing system, parts of the plasma processing system may be damaged, a substantial number of the wafers may need to be scrapped and wasted, production time and other resources may be wasted, and/or the manufacturing yield may be undesirable. Therefore, it may be desirable to perform tests to ensure the readiness of the plasma processing system before processing wafers.

Conventionally, a number of test wafers may be test-processed with plasma in the plasma processing chamber, and the readiness of the plasma processing system may be determined based on the results of the test-processing. The test process may incur a substantial amount of cost and may consume a substantial amount of resources.

Alternatively, for saving cost and resources, plasma processing system readiness tests may be performed by comparing the measured electrical property values, such as the voltage, current, and/or phase angle value(s), at a certain location in the plasma processing system with a set of "fingerprints," or known electrical property values which indicate the readiness of the plasma processing system. The consumption of resources for generating plasma and the consumption of test wafers may be avoided in the test process. However, the differences between the measured electrical property values and the fingerprints may be caused by various reasons, including problems with a power delivery system, but not limited to faults in the plasma processing chamber. As a result, false positive alarms indicating problems with the plasma processing chamber may be provided, and a significant amount of time and resources may be wasted in trying to troubleshoot the faultless plasma processing chamber.

SUMMARY OF INVENTION

An embodiment of the invention is related to a test system for facilitating determining whether a plasma processing system is ready for processing wafers, wherein the plasma processing system includes a plasma processing chamber. The test system may include a computer-readable medium storing at least a test program. The test program may include code for receiving at least a plurality of electric parameter values. The plurality of electric parameter values may be derived from signals detected by at least one sensor. The signals may be detected by the at least one sensor when no plasma is present in the plasma processing chamber. The test program may also include code for generating a set of electric model parameter values using at least the plurality of electric parameter values and a mathematical model. The test program may also include code for comparing the set of electric model parameter values with a set of baseline model parameter value information. The test program may also include code for determining readiness of the plasma processing system based on the comparison. The test system may also include a set of circuit hardware for performing one or more tasks associated with the test program.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1A:
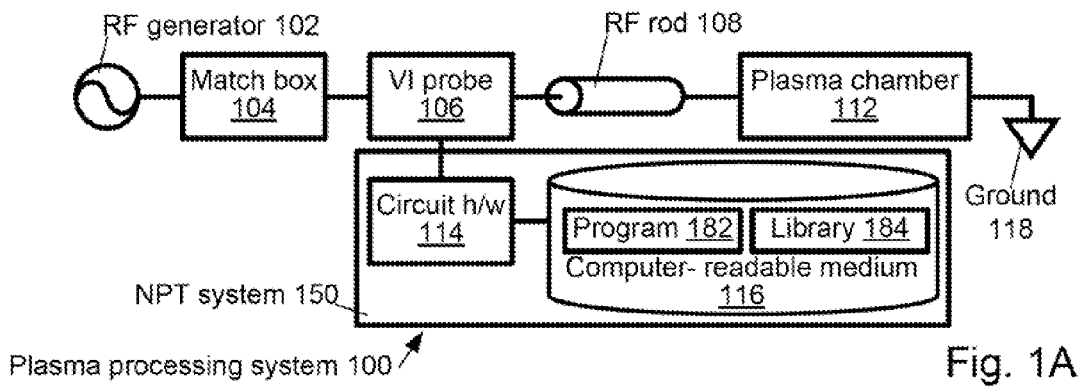
FIG. 1A shows a schematic block diagram illustrating a plasma processing system including a no-plasma test system (or NPT system) for testing the readiness of the plasma processing system in a test process involving multiple frequencies without generating plasma in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer-readable medium on which computer-readable instructions for carrying out embodiments of the inventive technique are stored. The computer-readable medium may include, for example, semiconductor, magnetic, opto-magnetic, optical, or other forms of computer-readable medium for storing computer-readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

One or more embodiments of the invention are related to a test system for facilitating determining whether a plasma processing system is ready for performing plasma processing. The plasma processing system may include a plasma processing chamber for containing plasma and a wafer to be processed. The test system may include a computer-readable medium storing at least a test program. The test system may also include a set of circuit hardware for performing one or more tasks associated with the test program.

The test program may include code for receiving at least a plurality of electric parameter values related to operation of a plasma processing system. The plurality of electric parameter values may be derived from signals detected by at least one sensor, such as a voltage-current probe (or VI probe) and/or a voltage control interface probe (VCI probe). The signals may be detected by the sensor(s) when no plasma is present in the plasma processing chamber. In general, the test system may facilitate determining the readiness of the plasma processing system without requiring generating plasma. Advantageously, resources associated with generating plasma may be conserved.

The test program may also include code for generating a set of electric model parameter values by inputting the plurality of electric parameter values to a mathematical model, with the set of electric model parameter values being the output of the mathematical model. The electric model parameter values may be associated with electric model parameters, such as a termination capacitance, a line capacitance, and a line inductance, of electric model components for modeling various parts of the plasma processing system. For example, the termination capacitance may be associated with a capacitor for modeling the plasma processing chamber; the line capacitance and the line inductance may be associated with another capacitor and an inductor, respectively, for modeling a transmission rod disposed between the plasma processing chamber and a power generator.

The test program may also include code for comparing the set of electric model parameter values with a set of baseline model parameter value information to determine the readiness of the plasma processing system.

As can be readily appreciated, the test system may associate different electric model parameters with different plasma processing system parts. Accordingly, the test system may be able to determine whether problems occur at the plasma processing chamber or at the transmission rod, without generating false positive alarms for a faultless plasma processing chamber. Advantageously, costs and resources associated with unnecessarily troubleshooting the plasma processing chamber and unnecessary downtime may be avoided, problems can be effectively resolved, and productivity may be improved.

The baseline model parameter value information may be generated utilizing sample electric parameter values associated with a plurality of frequencies and/or derived from signals detected by a plurality of sensors deployed at a plurality of different locations in the plasma processing system. Advantageously, consistency and accuracy in determining the readiness of the plasma processing chamber may be optimized.

One or more embodiments of the invention are related to a plasma processing system that includes the abovementioned test system.

One or more embodiments of the invention are related to a method pertaining to the abovementioned test system.

The features and advantages of the present invention may be better understood with reference to the figures and discussions that follow.

FIG. 1A shows a schematic block diagram illustrating a plasma processing system 100 including a no-plasma test system 150 (or NPT system 150) for testing the readiness of plasma processing system 100 (including a plasma processing chamber 112) in a test process involving multiple frequencies without generating plasma in accordance with one or more embodiments of the present invention.

Plasma processing chamber 112 may be configured for containing plasma and a wafer when the wafer is processed utilizing the plasma inside plasma processing chamber 112. For example, plasma processing chamber 112 may represent an inductively coupled plasma (ICP) chamber, a capacitively coupled plasma (CCP) chamber, or a transformer coupled plasma (TCP) chamber. Plasma processing chamber 112 may be grounded at ground 118.

Plasma processing system 100 may also include a power generator, such as a radio frequency power generator 102 (or RF generator 102), for providing an electric current through a match box 104 (or match network 104) and a radio frequency rod 108 (or RF rod 108) to, for example, a coil and/or an electrode of plasma processing chamber 112 for generating and/or sustaining the plasma for processing the wafer. RF rod 108 may be a coaxial feed cable for transmitting the electric current.

In one or more embodiments, RF generator 102 may be able to provide electric currents with a plurality of different frequencies. For example, RF generator may be able to provide a first current with a first frequency, a second current with a second frequency, and a third current with a third frequency, etc. Additionally or alternatively, plasma processing system 100 may include one or more power generators, such that electric currents with a plurality of different frequencies may be provided to plasma processing chamber 112. Utilizing multiple frequencies, embodiments of the invention may improve consistency and granularity in determining the readiness of plasma processing chamber 112. Example advantages of utilizing multiple frequencies are discussed with reference to the example of FIG. 3A.

Plasma processing system 100 may also include a sensor, such as a voltage current probe 106 (or VI probe 106), coupled between match box 104 and RF rod 108. The sensor may be employed for measuring electric parameter values, such as voltages, electric current magnitudes, and phase angles, associated with the currents received by plasma processing chamber 112.

NPT system 150 may be coupled with VI probe 106 for facilitating testing the readiness of plasma processing chamber 112. NPT system 150 may include a computer-readable medium 116 storing at least a no-plasma test program 182 (or NPT program 182). NPT program 182 may include code for utilizing electrical property values provided by VI probe 106 to compute model parameter values to facilitate testing the readiness of plasma processing chamber 112. Computer-readable medium 116 may also include a no-plasma test library 184 (or NPT library 184) storing baseline model parameter information. The baseline model parameter information may represent parameter values (and/or ranges thereof) that indicate the readiness of plasma processing chamber 112. NPT system 150 may compare the computed model parameter values with the baseline model parameter information to determine the readiness of plasma processing chamber 112. By utilizing model parameter values and model parameter baseline information (instead of electric parameter values and electric parameter fingerprints) in determining the readiness of plasma processing chamber 112, embodiments of the invention may prevent false positive alarms and associated waste of resources, and embodiments of the invention may also indicate the location of detected problems. An example electric model including the model parameters is illustrated in the example of FIG. 1B.

NPT system 150 may also include a set of circuit hardware 114 for performing tasks associated with NPT program 182 in facilitating testing the readiness of plasma processing chamber 112. Examples of the tasks are discussed with references to FIGS. 4-5.

Figure 1B:
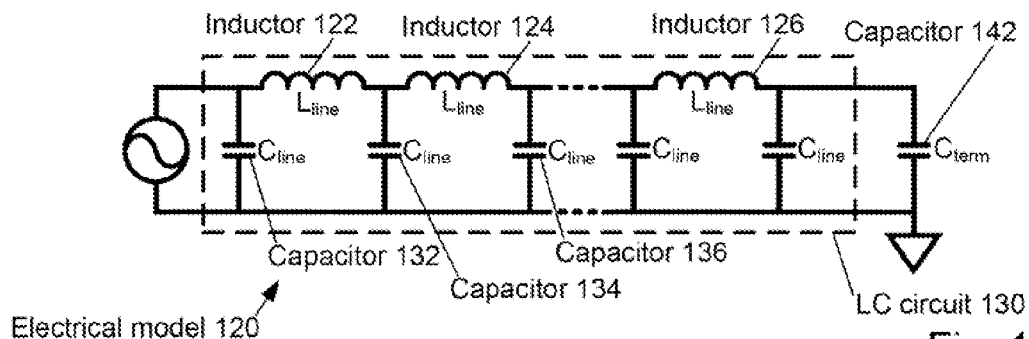
FIG. 1B shows a schematic representation illustrating an electrical model for modeling parts of a plasma processing system in accordance with one or more embodiments of the present invention.

FIG. 1B shows a schematic representation illustrating an electrical model 120 for modeling parts, such as plasma processing chamber 112 and RF rod 108, of plasma processing system 100 illustrated in the example of FIG. 1A in accordance with one or more embodiments of the present invention.

Electric model 120 may include a capacitor 142 for modeling plasma processing chamber 112. Capacitor 142 may be represented by a capacitance, denoted $C_{term}$, meaning the capacitance at the termination, or termination capacitance.

Electric model 120 may also include an inductor-capacitor circuit 130 (or LC circuit 130) for modeling RF rod 108. LC circuit 130 may include one or more inductors, such as inductor 122, inductor 124, and/or inductor 126, represented by one or more parameters, such as an inductance, denoted meaning an inductance of the power transmission line, or line inductance. LC circuit 130 may also include one or more capacitors, such as capacitor 132, capacitor 134, and/or capacitor 136, represented by one or more parameters, such as a capacitance, denoted $C_{line}$, meaning a capacitance of the power transmission line, or line capacitance.

The values of the parameters $C_{term}$, $L_{line}$, and $C_{line}$ may be computed utilizing electric parameter (e.g., voltage, current, and/or phase angle) values determined based on measurement performed by an electric parameter sensor, such as VI probe 106 illustrated in the example of FIG. 1A, when an electric current is provided to plasma processing chamber 112 through RF rod 108. Anomaly of the value of $C_{term}$ may indicate problems associated with plasma processing chamber 112; anomaly of the $L_{line}$ value and/or the $C_{line}$ value may indicate problems associated with RF rod 108 (and/or the associated power delivery system). Accordingly, when problems are identified, NPT system 150 may be able to determine whether the problems are associated with plasma processing chamber 112 or the upstream power delivery system. Advantageously, false positive alarms and unnecessary troubleshooting associated with plasma processing chamber 112 may be prevented, and resources may be conserved.

Embodiments of the invention may enable multiple electric current with multiple different frequencies to be provided to plasma processing chamber 112. Accordingly, multiple parameters $C_{term}$, $L_{line}$, and $C_{line}$ may be computed simultaneously. Advantageously, embodiments of the invention may improve granularity and accuracy in testing the readiness of plasma processing chamber 112 since more parameters can be estimated (that is, less parameter values have to be assumed to be constant) and with greater certainty using a non-linear regression scheme such as the Levenberg-Marquardt regression scheme.

Figure 2A:
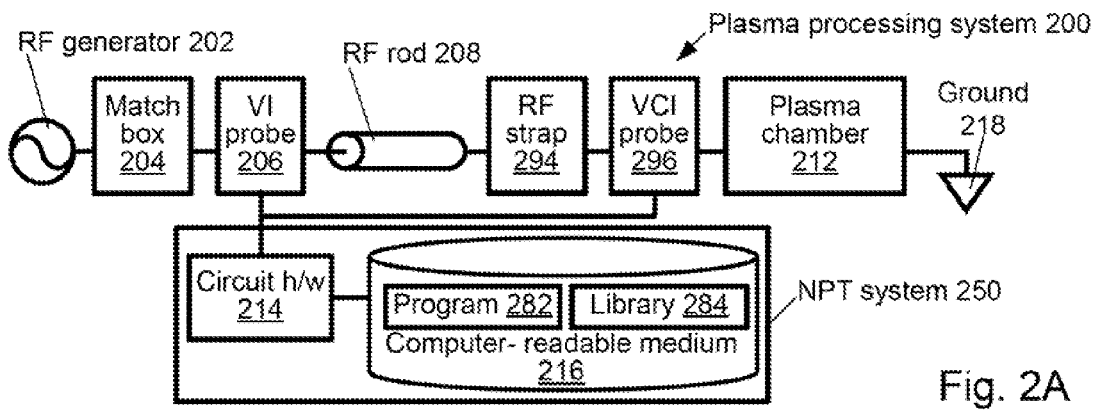
FIG. 2A shows a schematic block diagram illustrating a plasma processing system including a no-plasma test system (or NPT system) for testing the readiness of the plasma processing system in a test process involving multiple measurement points without generating plasma in accordance with one or more embodiments of the present invention.

FIG. 2A shows a schematic block diagram illustrating a plasma processing system 200 including a no-plasma test system 250 (or NPT system 250) for testing the readiness of plasma processing system 200 (including a plasma processing chamber 212) in a test process involving multiple measurement points without generating plasma in accordance with one or more embodiments of the present invention.

Plasma processing chamber 212 may be configured for containing plasma and a wafer when the wafer is processed utilizing the plasma inside plasma processing chamber 212. For example, plasma processing chamber 112 may represent an inductively coupled plasma (ICP) chamber, a capacitively coupled plasma (CCP) chamber, or a transformer coupled plasma (TCP) chamber. Plasma processing chamber 212 may be grounded at ground 218.

Plasma processing system 200 may also include a power generator, such as a radio frequency power generator 202 (or RF generator 202), for providing an electric current through a match box 204 (or match network 204), a radio frequency rod 208 (or RF rod 208), and a radio frequency strap 294 (or RF strap 294) to, for example, a coil and/or an electrode of plasma processing chamber 212 for generating and/or sustaining the plasma for processing the wafer. RF rod 208 may be a coaxial feed cable for transmitting the electric current. RF strap 294 may represent a coupling mechanism between RF rod 208 and plasma processing chamber 212.

Plasma processing system 100 may also include a plurality of sensors including at least a first sensor and a second sensor, such as a voltage current probe 206 (or VI probe 206) and a voltage control interface probe 296 (or VCI probe 296). VI probe 206 may be coupled between match box 204 and RF rod 208. VCI probe 296 may be coupled between RF strap 294 and plasma processing chamber 212. The plurality of sensors may be employed for providing a plurality of measurement points (or multiple measurement points) for electric parameter values, such as voltages, electric current magnitudes, and phase angles, associated with the currents received by plasma processing chamber 212.

Utilizing multiple measurement points, embodiments of the invention may improve consistency and granularity in determining the readiness of plasma processing chamber 212. Example advantages of utilizing multiple measurement points are discussed with reference to the example of FIG. 3B.

NPT system 250 may be coupled with VI probe 206 and VCI probe 296 for facilitating testing the readiness of plasma processing chamber 212. NPT system 250 may include a computer-readable medium 216 storing at least a no-plasma test program 282 (or NPT program 282). NPT program 282 may include code for utilizing the plurality of electrical property values provided by VI probe 206 and VCI probe 296 to compute a plurality of model parameter values to facilitate testing the readiness of plasma processing chamber 212. Computer-readable medium 216 may also include a no-plasma test library 284 (or NPT library 284) storing baseline model parameter information. The baseline model parameter information may represent parameter values (and/or ranges thereof) that indicate the readiness of plasma processing chamber 212. NPT system 250 may compare the computed model parameter values with the baseline model parameter information to determine the readiness of plasma processing chamber 212. By utilizing model parameter values and model parameter baseline information (instead of electric parameter values and electric parameter fingerprints) in determining the readiness of plasma processing chamber 212, embodiments of the invention may prevent false positive alarms and associated waste of resources, and embodiments of the invention may also indicate the location of detected problems. An example electric model including the model parameters is illustrated in the example of FIG. 2B.

NPT system 250 may also include a set of circuit hardware 214 for performing tasks associated with NPT program 282 in facilitating testing the readiness of plasma processing chamber 212. Examples of the tasks are discussed with references to FIGS. 4-5.

Figure 2B:
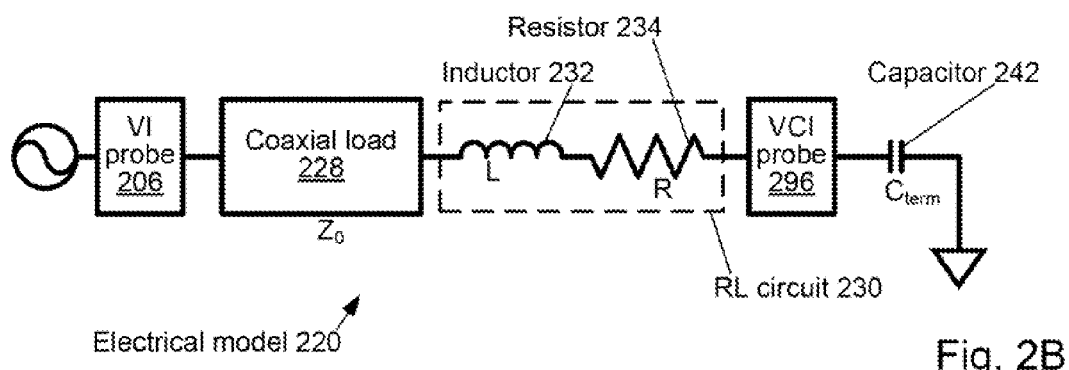
FIG. 2B shows a schematic representation illustrating an electrical model for modeling parts of a plasma processing system in accordance with one or more embodiments of the present invention.

FIG. 2B shows a schematic representation illustrating an electrical model 220 for modeling parts, such as plasma processing chamber 212, RF strap 294, and RF rod 208, of plasma processing system 200 illustrated in the example of FIG. 2A in accordance with one or more embodiments of the present invention.

Electric model 220 may include a capacitor 242 for modeling plasma processing chamber 212. Capacitor 242 may be represented by a capacitance, denoted $C_{term}$, meaning the capacitance at the termination, or termination capacitance.

Electric model 220 may also include a resistor-inductor circuit 230 (or RL circuit 230) for modeling RF strap 294. RL circuit 230 may include one or more resistors, such as resistor 234, represented by one or more parameters, such as a resistance, denoted R. RL circuit 230 may also include one or more inductors, such as inductor 232, represented by one or more parameters, such as an inductance, L.

Electric model 220 may also include a coaxial load 228 for modeling RF rod 208. Coaxial load 228 may be represented by an impedance, denoted $Z_0$. Alternatively or additionally, electric model 220 may include an inductor-capacitor circuit (or LC circuit) similar to LC circuit 130 illustrated in the example of FIG. 1B for modeling RF rod 208.

The values of the parameters $C_{term}$, R, L, and $Z_0$ may be computed utilizing electric parameter (e.g., voltage, current, and/or phase angle) values determined based on measurement performed by a plurality of electric parameter sensors, such as VI probe 206 and VCI probe 296, deployed at a plurality of locations. Anomaly of the value of $C_{term}$ may indicate problems associated with plasma processing chamber 212; anomaly of the R value, the L value, and/or the $Z_0$ value may indicate problems associated with RF strap 294, RF rod 208, and/or the associated power delivery system. Accordingly, when problems are identified, NPT system 250 may be able to determine whether the problems are associated with plasma processing chamber 212 or the upstream power delivery system. Advantageously, false positive alarms and unnecessary troubleshooting associated with plasma processing chamber 212 may be prevented, and resources may be conserved.

With a plurality of electric parameter sensors deployed at a plurality of locations, embodiments of the invention may reduce noises and errors in determining the electric model parameter values. Advantageously, embodiments of the invention may improve accuracy in testing the readiness of plasma processing chamber 212.

Figures 3A, 3B:
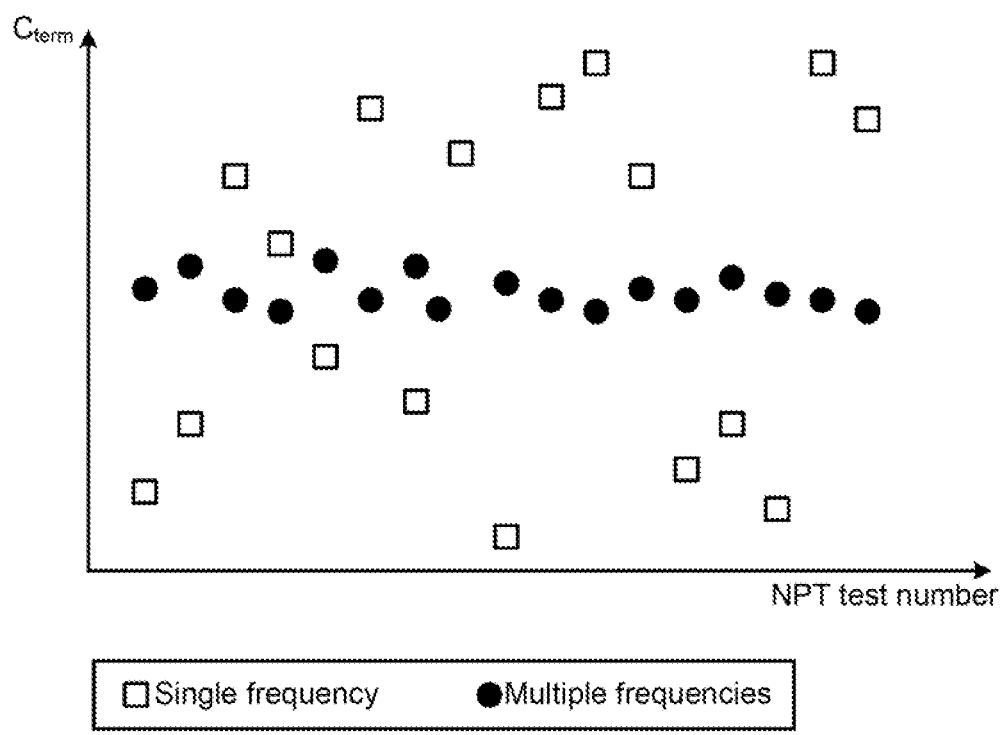
FIG. 3A shows a schematic graph illustrating the advantages of a test process involving multiple frequencies in accordance with one or more embodiments of the present invention.
FIG. 3B shows a schematic graph illustrating the advantages of a test process involving multiple measurement points in accordance with one or more embodiments of the present invention.

FIG. 3A shows a schematic graph illustrating the advantage of a test process involving multiple frequencies in accordance with one or more embodiments of the present invention. With electric parameter values measured given a plurality of currents with a plurality of different frequencies, NPT system 150 (illustrated in the example of FIG. 1A) may reduce noises and errors in computing the values of the parameters of electric model 120 (illustrated in the example of FIG. 1B). Given that the values of $L_{line}$ and $C_{line}$ are fixed, the noises and/or errors in the values of $C_{term}$ are substantially reduced in the multiple-frequency scenario compared with the single-frequency scenario. As illustrated in the example of FIG. 3A, the computed values of $C_{term}$ during numerous NPT tests (and/or the computed baseline values of $C_{term}$ in library implementation) occurring over an extended period of time of plasma processing chamber 112 (illustrated in the example of FIG. 1A) are more consistent and are distributed within a narrower range in the multiple-frequency scenario than in the single-frequency scenario. The consistency and repeatability of $C_{term}$ for a given hardware configuration is critical and ensures that the NPT analysis is reliable in fault detection of a plasma processing chamber. Advantageously, the accuracy in determining the readiness of plasma processing chamber 112 may be improved in accordance with the multiple-frequency embodiments of the invention.

FIG. 3B shows a schematic graph illustrating the advantage of a test process involving multiple measurement points in accordance with one or more embodiments of the present invention. With electric parameter values measured at a plurality of locations in plasma processing system 200 (illustrated in the example of FIG. 2A), NPT system 250 (illustrated in the example of FIG. 2A) may reduce noises and errors in computing the values of the parameters of electric model 220 (illustrated in the example of FIG. 2B). Given that the values of other electric model parameters are fixed, the noises and/or errors in the values of $C_{term}$ are substantially reduced in the multiple-measurement-point scenario compared with the single-measurement-point scenario. As illustrated in the example of FIG. 3B, the computed values of $C_{term}$ during numerous NPT tests (and/or the computed baseline values of $C_{term}$ in library implementation) occurring over an extended period of time of plasma processing chamber 212 (illustrated in the example of FIG. 2A) are more consistent and are distributed within a narrower range in the multiple-measurement-point scenario than in the single-measurement-point scenario. The consistency and repeatability of $C_{term}$ for a given hardware configuration is critical and ensures that the NPT analysis is reliable in fault detection of a plasma processing chamber. Advantageously, the accuracy in determining the readiness of plasma processing chamber 212 may be improved in accordance with the multiple-frequency embodiments of the invention.

Figure 4:
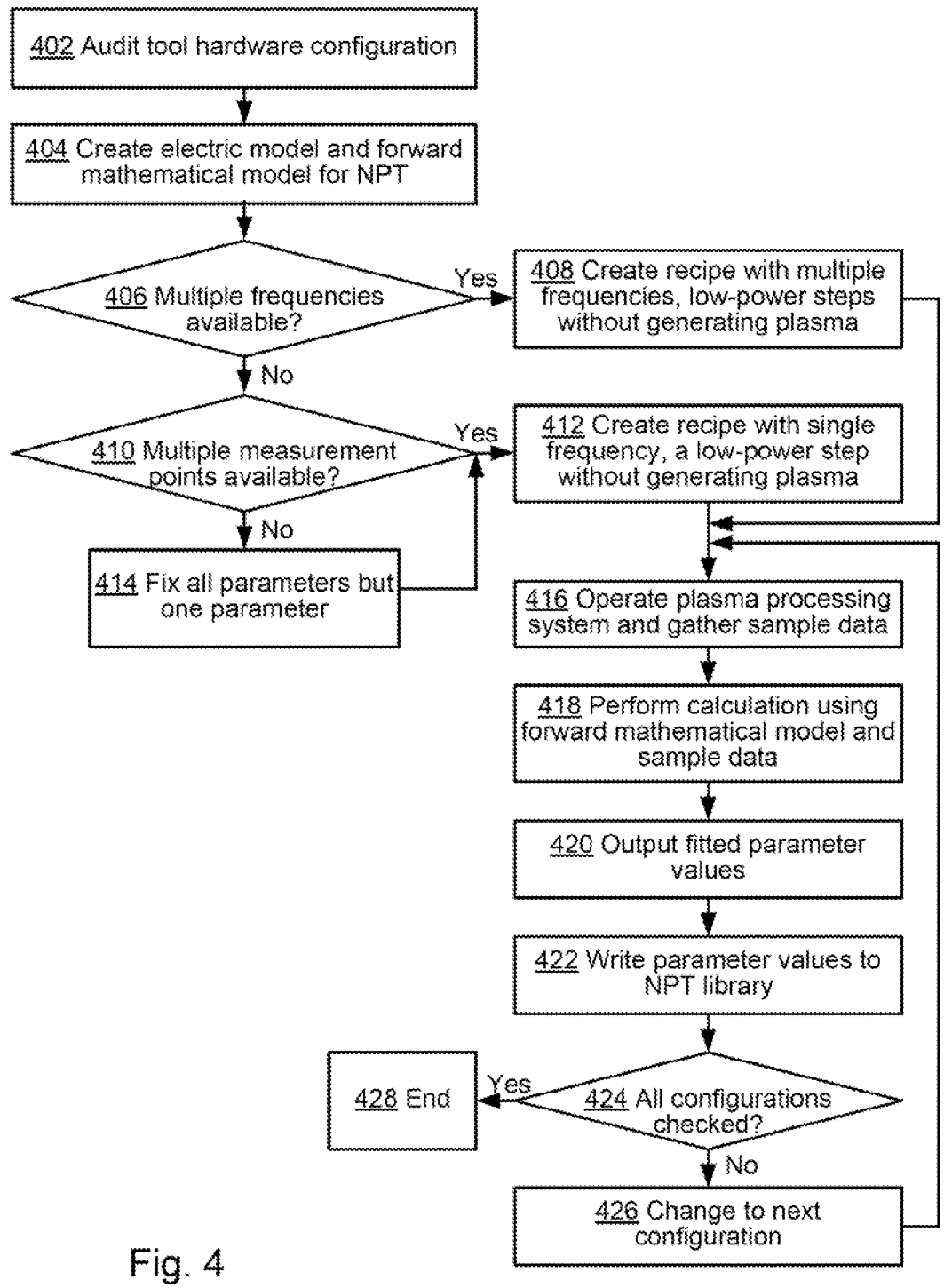
FIG. 4 shows a schematic flowchart illustrating tasks/steps pertaining to a NPT system for implementing a no-plasma test library (or NPT library) for facilitating determining the readiness of a plasma processing system in accordance with one or more embodiments of the present invention.

FIG. 4 shows a schematic flowchart illustrating tasks/steps pertaining to a NPT system (such as NPT system 150 illustrated in the example of FIG. 1A or NPT system 250 illustrated in the example of FIG. 2A) for implementing a no-plasma test library (such as NPT library 184 illustrated in the example of FIG. 1A or NPT library 284 illustrated in the example of FIG. 2A) for facilitating testing the readiness of a plasma processing system (such as plasma processing system 100 illustrated in the example of FIG. 1A or plasma processing system 200 illustrated in the example of FIG. 2A) in accordance with one or more embodiments of the present invention. In this application, the term "step" may represent a process step related to determining plasma processing chamber readiness and/or a task related to the NPT system. The NPT system may include computer-readable code related to performing the step and/or the task.

The tasks/steps may include step 402, in which the NPT system and/or a related user may audit the tool hardware configuration related to the plasma processing chamber. Step 402 may involve one or more of determining frequencies that drive the power or current supplied to the plasma processing chamber, determining which electrode is powered, determining which plasma processing chamber components are to be modeled in an electric model, etc. Accordingly, the hardware configuration related to the plasma processing system, for example, similar to the configuration illustrated in the example of FIG. 1A or FIG. 2A, may be determined.

In step 404, the NPT system may and/or a related user may create an electrical model, for example, similar to the electric model illustrated in the example of FIG. 1B or FIG. 2B. The electric model may be represented a forward mathematical model such that the model parameter values (e.g., the values of $C_{term}$, $L_{line}$, and/or $C_{line}$) may be calculated when related electric parameter values (i.e., the measured voltage, current, and/or phase angle values) are known. The forward mathematical model may be used in conjunction with one of several well-known regression algorithms such as a Levenberg-Marquardt algorithm in step 418. Alternatively or additionally, an inverse mathematical model may be utilized.

In step 406, the NPT system may determine whether multiple frequencies are available for currents provided to the plasma processing chamber (or determine the number of different frequencies available for the currents). For example, the NPT system may determine whether the plasma processing system includes a plurality of power generators and/or may determine whether the power generator of the plasma processing system can generate currents with a plurality of different frequencies. In general, given a plurality of frequencies, the abovementioned mathematical model may provide more accurate, robust results with better granularity relative to results generated under only one single frequency. If multiple frequencies are available, control may be transferred to step 408; if only one frequency is available, control may be transferred to step 410.

In step 408, the NPT system may create a multiple-step recipe involving the multiple frequencies (or the plurality of frequencies). The recipe may include a plurality of operating steps (or process steps) associated with the plurality of frequencies. For example, the recipe may include a first operating step associated with a first electric current with a first frequency and a second operating step associated with a second electric current with a second frequency. The operating steps may be low-power steps such that no plasma is generated according to the multiple-step recipe.

In step 410, the NPT system may determine whether multiple measurement points are available in the plasma processing system (or determine the number of sensors deployed at different locations). For example, the NPT system may determine whether the plasma processing system includes a plurality of electric parameter sensors deployed at a plurality of locations in the plasma processing system. If multiple measurement points (or multiple sensors at different locations) are available, control may be transferred to step 412; if only one measurement point (or only one sensor) is available, control may be transferred to step 414.

In step 414, the NPT system may fix all parameters but one parameter, i.e., the NPT system may designate one parameter value to be unknown and keep all the remaining parameter values at known constant values. Control may then be transferred to step 412.

In step 412, the NPT system may create a single-step recipe associated with the single frequency. The recipe may include only one operating step. The operating step may be a low-power step such that no plasma is generated according to the single-step recipe.

In step 416, The NPT may instruct the plasma processing system to operate according to the multiple-step recipe resulting from step 408 or according to the single-step recipe resulting from step 412. The NPT system may gather sample data resulting from the operation of the plasma processing chamber. The sample data may include electric parameter values such as voltage, current, and/or phase angle values derived from signals detected by the one or more sensors.

In step 418, the NPT system may perform calculation utilizing the forward mathematical model (resulted from step 404) and the sample data (resulted from step 416).

In step 420, the NPT system may output fitted parameter values, such as one or more values of $C_{term}$, $L_{line}$, $C_{line}$, R, L, and/or $Z_0$ illustrated in the examples of FIG. 1B and/or FIG. 2B.

In step 422, the NPT system may write the fitted parameter values to the associated NPT library, such as NPT library 184 illustrated in the example of FIG. 1A or NPT library 284 illustrated in the example of FIG. 2A. The fitted parameter values may be utilized as baseline information for determining whether the plasma processing chamber is ready for processing wafers.

In step 424, the NPT system may determine whether baseline model parameter value information has been obtained and included in the NPT library for all necessary configurations (e.g., tool hardware configurations and/or software configurations) associated with the plasma processing chamber. If the baseline model parameter value information for all the necessary configurations have been included in the NPT library, control may be transferred to step 428; if the baseline model parameter value information for at least one necessarily configuration has not been included in the NPT library, control may be transferred to step 426.

In step 426, the NPT system may provide instruction for changing hardware and/or software to the next configuration. Control may then be transferred back to step 416 for gathering further sample data to obtain further baseline model parameter value information in the subsequent steps 418-422.

In step 428, the process of implementing the NPT library is completed, and the NPT library may be utilized in determining the readiness of the plasma processing system.

In one or more embodiments, the NPT system may repeat one or more of the steps illustrated in the example of FIG. 4 sequentially for a plurality of critical electrodes of the plasma processing system or for all electrodes of the plasma processing system. For example, the NPT system may first perform the steps for a top electrode of the plasma processing system, and then perform the steps for a bottom electrode of the plasma processing system. As another example, the NPT system may first perform the steps for a first electrode of the plasma processing, then perform the steps for a second electrode of the plasma processing system, and then perform the steps for a third electrode of the plasma processing system. Advantageously, a comprehensive NPT library may be implemented.

Based on the examples discussed in this specification, one of ordinary skill in the art should be able to construct one or more appropriate electric models and/or one or more appropriate mathematical models for each of the electrodes without undue experimentation, even if the electrodes are structurally different.

Figure 5:
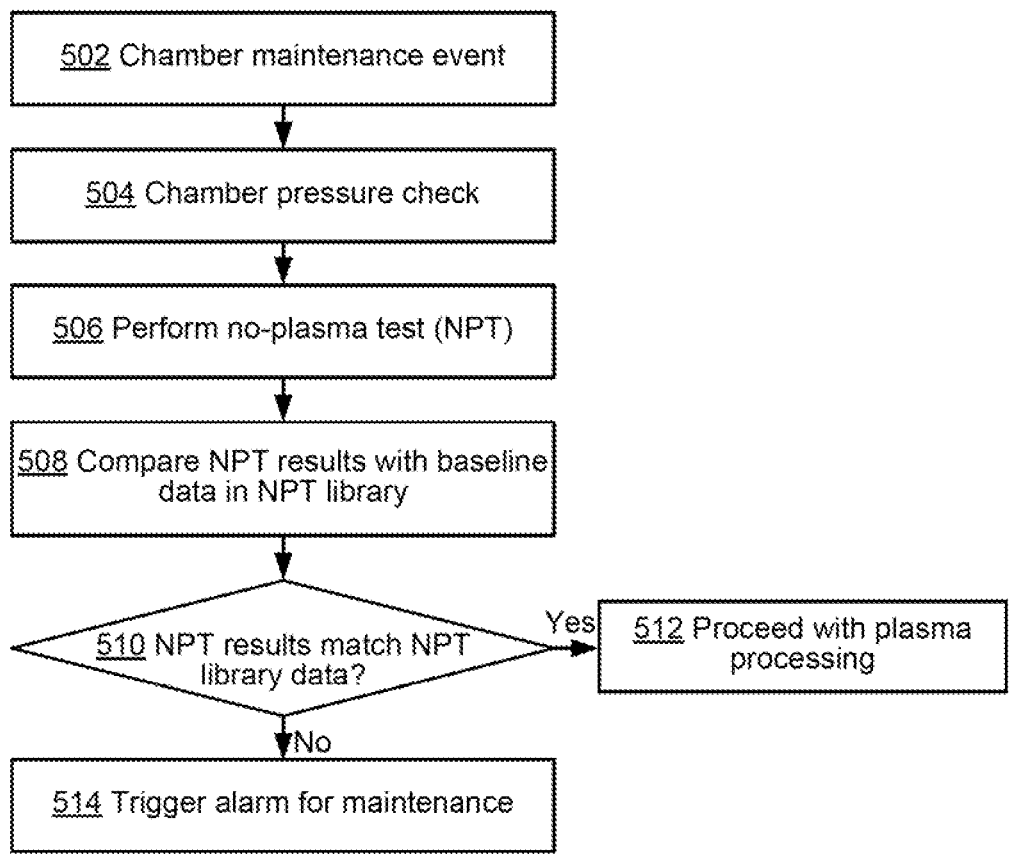
FIG. 5 shows a schematic flowchart illustrating tasks/steps pertaining to a NPT system for determining the readiness of a plasma processing system in accordance with one or more embodiments of the present invention.

FIG. 5 shows a schematic flowchart illustrating tasks/steps pertaining to a NPT system (such as NPT system 150 illustrated in the example of FIG. 1A or NPT system 250 illustrated in the example of FIG. 2A) for testing the readiness of a plasma processing system (such as plasma processing system 100 illustrated in the example of FIG. 1A or plasma processing system 200 illustrated in the example of FIG. 2A) in accordance with one or more embodiments of the present invention.

In step 502, the NPT system may detect that a chamber maintenance event has occurred. For example, the plasma processing chamber may have been opened, one or more parts of the chamber may have been swapped, etc., and the plasma processing chamber lid may have been replaced (i.e., closed) after the maintenance actions.

In step 504, the NPT system (or a related user) may provide instructions for ensuring the pressure in the chamber is at a desirable level. The pressure may be reduced if necessary.

In step 506, the NPT system may provide instructions for the plasma processing system to perform a no-plasma test (or NPT) for the plasma processing chamber. In the no-plasma test, the power generator of the plasma processing system may provide a low-power electric current to the plasma processing chamber for measuring electric parameter values without striking any plasma in the plasma processing chamber. Electric model parameter values may be calculated using the electric parameter values and the aforementioned mathematical model.

In step 508, the NPT system may compare the NPT results (i.e., the electric model parameter values) with baseline model parameter value data/information in the NPT library, e.g., NPT library 184 illustrated in the example of FIG. 1A or NPT library 284 illustrated in the example of FIG. 2A resulted from the tasks/steps illustrated in the example of FIG. 4.

In step 510, the NPT system may determine whether the NPT results match the baseline model parameter value data in the NPT library (or whether the NPT results are within predetermined ranges defined in the baseline parameter data). If the NPT results match the baseline model parameter value data, control may be transferred to step 512; if the NPT results do not match the baseline model parameter value data, control may be transferred to step 514.

In step 512, the NPT system may determine that the plasma processing system is ready to process wafers and may provide instructions for the plasma processing system to proceed with plasma processing.

In step 514, the NPT system may determine whether the problems are associated with the plasma processing chamber (e.g., caused by an incorrect inter-electrode gap size) or associated with the upstream power delivery system. The NPT system may also trigger an alarm for performing maintenance to resolve the problems. An NPT may be conducted after the maintenance has been performed.

In one or more embodiments, the NPT system may repeat one or more of the steps illustrated in the example of FIG. 5 sequentially for a plurality of critical electrodes of the plasma processing system or for all electrodes of the plasma processing system. For example, the NPT system may first perform the steps for a top electrode of the plasma processing system, and then perform the steps for a bottom electrode of the plasma processing system. As another example, the NPT system may first perform the steps for a first electrode of the plasma processing, then perform the steps for a second electrode of the plasma processing system, and then perform the steps for a third electrode of the plasma processing system. Advantageously, a comprehensive NPT may be performed, and the readiness of the plasma processing system may be accurately determined.

As can be appreciated from the foregoing, embodiments of the invention may associate different electric model parameters with different plasma processing system parts. Accordingly, the test system may be able to determine whether problems occur at the plasma processing chamber or at the transmission rod. False positive alarms associated with the plasma processing chamber may be prevented. Advantageously, costs and resources associated with unnecessary troubleshooting and unnecessary downtime may be avoided, problems can be effectively resolved, and productivity may be improved.

Embodiments of the invention may generate baseline model parameter value information for chamber readiness test utilizing sample electric parameter values associated with a plurality of frequencies and/or derived from signals detected by a plurality of sensors deployed at a plurality of different locations in the plasma processing system. Advantageously, consistency and accuracy in determining the readiness of the plasma processing chamber may be optimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A computer-readable non-transitory program storage medium executable by a processor and having computer readable code stored therein, the computer readable code being configured as a test program and when executed executes a process for causing a computer processor to perform testing regarding whether a plasma processing chamber in a plasma processing system is ready for processing at least one wafer, the test program of the non-transitory program storage medium including at least:
 code for receiving at least a plurality of electric parameter values, the plurality of electric parameter values being derived from signals detected by at least one sensor, the signals being detected by the at least one sensor when no plasma is present in the plasma processing chamber;

code for generating a set of electric model parameter values using at least the plurality of electric parameter values and a mathematical model;

code for comparing the set of electric model parameter values with a set of baseline model parameter value information;

code for determining readiness of the plasma processing system based on at least a result the comparing; and code for including at least a first capacitance a second capacitance and an inductance in the mathematical model;

code for associating the first capacitance with the plasma processing chamber;

code for associating the second capacitance with a transmission rod the transmission rod being coupled between the plasma processing chamber and a power generator; and code for associating the inductance with the transmission rod, wherein the set of electric model parameter values includes a value of the first capacitance a value of the second capacitance and a value of the inductance.

2. The computer-readable non-transitory program storage medium of claim 1 further comprising:

code for determining that the plasma processing chamber is not ready for plasma processing when the value of the first capacitance is outside a predetermined capacitance value range defined in the set of baseline model parameter value information;

code for indicating the plasma processing chamber as being problematic when the value of the first capacitance is outside the predetermined capacitance value range; and code for indicating the transmission rod as being problematic when at least one of the value of the second capacitance and the value of the inductance is outside at least one predetermined parameter value range defined in the set of baseline model parameter value information.

3. The computer-readable non-transitory program storage medium of claim 1, further comprising:

code for including at least a capacitance, a resistance, and an inductance in the mathematical model;

code for associating the capacitance with the plasma processing chamber;

code for associating the resistance with a coupling mechanism, the coupling mechanism being coupled between the plasma processing chamber and a power generator; and code for associating the inductance with the coupling mechanism, wherein the set of electric model parameter values includes a value of the capacitance, a value of the resistance, and a value of the inductance.

4. The computer-readable non-transitory program storage medium of claim 3, further comprising:

code for determining that the plasma processing chamber is not ready for plasma processing when the value of the capacitance is outside a predetermined capacitance value range defined in the set of baseline model parameter value information;

code for indicating the plasma processing chamber as being problematic when the value of the capacitance is outside the predetermined capacitance value range; and code for indicating the coupling mechanism as being problematic when at least one of the value of the resistance and the value of the inductance is outside at least one predetermined parameter value range defined in the set of baseline model parameter value information.

5. The computer-readable non-transitory program storage medium of claim 1, further comprising:

code for determining whether at least a first current with a first frequency and a second current with a second frequency are available to the plasma processing chamber;

code for creating a multiple-step recipe for operating the plasma processing chamber if at least the first current with the first frequency and the second current with the second frequency are available to the plasma processing chamber, the multiple-step recipe including at least a first operating step and a second operating step, the first operating step being associated with the first frequency, the second operating step being associated with the second frequency;

code for gathering a set of sample data from at least the first operating step and the second operating step;

code for calculating a set of fitted parameter values using the set of sample data and the mathematical model; and code for including the set of fitted parameter values in the baseline model parameter value information.

6. The computer-readable non-transitory program storage medium of claim 5, further comprising:

code for creating a single-step recipe for operating the plasma processing chamber if only one single frequency is available to the plasma processing chamber, the single-step recipe including at most one single operating step associated with the single frequency;

code for gathering a second set of sample data from the single operating step;

code for calculating a second set of fitted parameter values using the second set of sample data and the mathematical model; and code for including the second set of fitted parameter values in the baseline model parameter value information.

7. A plasma processing system for processing at least a wafer, the plasma processing system comprising:

a plasma processing chamber for containing at least the wafer;

at least one sensor for sensing a plurality of electric characteristics related to operation of the plasma processing system;

a processor;

a computer-readable non-transitory program storage medium having computer readable code stored therein and executable by the processor, the computer readable code being configured as a test program so that when executed executes a process for causing the processor to perform testing regarding whether the plasma processing chamber in the plasma processing system is ready for processing the at least one wafer, the test program of the non-transitory program storage medium including at least:

code for receiving at least a plurality of electric parameter values, the plurality of electric parameter values being derived from signals detected by the at least one sensor, the signals being detected by the at least one sensor when no plasma is present in the plasma processing chamber;

code for generating a set of electric model parameter values using at least the plurality of electric parameter values and a mathematical model;

code for comparing the set of electric model parameter values with a set of baseline model parameter value information;

code for determining whether the plasma processing system is ready for processing wafers based on at least a result of the comparing;

code for including at least a first capacitance, a second capacitance, and an inductance in the mathematical model;

code for associating the first capacitance with the plasma processing chamber;

code for associating the second capacitance with a transmission rod, the transmission rod being coupled between the plasma processing chamber and a power generator;

code for associating the inductance with the transmission rod, wherein the set of electric model parameter values includes a value of the first capacitance, a value of the second capacitance, and a value of the inductance; and a set of circuit hardware responsive to the test program for performing one or more tasks associated with the test program for facilitating testing readiness of the plasma processing system for processing a wafer in the plasma processing chamber.

8. The plasma processing system of claim 7 further wherein the computer-readable non-transitory program storage medium further comprises:

code for determining that the plasma processing system is not ready for plasma processing when the value of the first capacitance is outside a predetermined capacitance value range defined in the set of baseline model parameter value information;

code for indicating the plasma processing chamber as being problematic when the value of the first capacitance is outside the predetermined capacitance value range; and code for indicating the transmission rod as being problematic when at least one of the value of the second capacitance and the value of the inductance is outside at least one predetermined parameter value range defined in the set of baseline model parameter value information.

9. The plasma processing system of claim 7, further wherein the computer-readable non-transitory program storage medium further comprises:

code for determining whether at least a first current with a first frequency and a second current with a second frequency are available to the plasma processing chamber;

code for creating a multiple-step recipe for operating the plasma processing chamber if at least the first current with the first frequency and the second current with the second frequency are available to the plasma processing chamber, the multiple-step recipe including at least a first operating step and a second operating step, the first operating step being associated with the first frequency, the second operating step being associated with the second frequency;

code for gathering a set of sample data from at least the first operating step and the second operating step;

code for calculating a set of fitted parameter values using the set of sample data and the mathematical model; and code for including the set of fitted parameter values in the baseline model parameter value information.

10. The plasma processing system of claim 7, further comprising:

a power generator for providing at least a current to the plasma processing chamber; a transmission rod disposed between the power generator and the plasma processing chamber for transmitting the current;

a coupling mechanism disposed between the transmission rod and the plasma processing chamber for coupling the transmission rod with the plasma processing chamber;

a voltage-current sensor coupled between the power generator and the transmission rod for measuring a first set of electric characteristics related to the operation of the plasma processing system; and a voltage sensor coupled between the coupling mechanism and the plasma processing chamber for measuring a second set of electric characteristics related to the operation of the plasma processing system, wherein the at least one sensor includes the voltage-current sensor and the voltage sensor.

11. The plasma processing system of claim 7, further wherein the computer-readable non-transitory program storage medium further comprises:

code for including at least a capacitance, a resistance, and an inductance in the mathematical model;

code for associating the capacitance with the plasma processing chamber;

code for associating the resistance with a coupling mechanism, the coupling mechanism being coupled between the plasma processing chamber and a power generator; and code for associating the inductance with the coupling mechanism, wherein the set of electric model parameter values includes a value of the capacitance, a value of the resistance, and a value of the inductance.

12. The plasma processing system of claim 11, further wherein the computer-readable non-transitory program storage medium further comprises:

code for determining that the plasma processing system is not ready for plasma processing when the value of the capacitance is outside a predetermined capacitance value range defined in the set of baseline model parameter value information;

code for indicating the plasma processing chamber as being problematic when the value of the capacitance is outside the predetermined capacitance value range; and code for indicating the coupling mechanism as being problematic when at least one of the value of the resistance and the value of the inductance is outside at least one predetermined parameter value range defined in the set of baseline model parameter value information.

13. A computer-implemented method for facilitating determining whether a plasma processing system is ready for processing at least one wafer in a plasma processing chamber of the plasma processing system, the method comprising:

receiving at least a plurality of electric parameter values, the plurality of electric parameter values being derived from signals detected by at least one sensor, the signals being detected by the at least one sensor when no plasma is present in the plasma processing chamber;

generating a set of electric model parameter values using at least the plurality of electric parameter values and a mathematical model;

comparing the set of electric model parameter values with a set of baseline model parameter value information; and determining readiness of the plasma processing system, by using a processor responsive to the comparing for facilitating testing readiness of the at least one wafer when no plasma is present in the plasma processing chamber;

including at least a first capacitance, a second capacitance, and an inductance in the mathematical model;

associating the first capacitance with the plasma processing chamber;

associating the second capacitance with a transmission rod the transmission rod being coupled between the plasma processing chamber and a power generator; and associating the inductance with the transmission rod, wherein the set of electric model parameter values includes a value of the first capacitance, a value of the second capacitance, and a value of the inductance.

14. The method of claim 13, further comprising:

determining that the plasma processing chamber is not ready for plasma processing when the value of the first capacitance is outside a predetermined capacitance value range defined in the set of baseline model parameter value information;

indicating the plasma processing chamber as being problematic when the value of the first capacitance is outside the predetermined capacitance value range; and indicating the transmission rod as being problematic when at least one of the value of the second capacitance and the value of the inductance is outside at least one predetermined parameter value range defined in the set of baseline model parameter value information.

15. The method of claim 13, further comprising:

determining whether at least a first current with a first frequency and a second current with a second frequency are available to the plasma processing chamber;

creating a multiple-step recipe for operating the plasma processing chamber if at least the first current with the first frequency and the second current with the second frequency are available to the plasma processing chamber, the multiple-step recipe including at least a first operating step and a second operating step, the first operating step being associated with the first frequency, the second operating step being associated with the second frequency;

gathering a set of sample data from at least the first operating step and the second operating step;

calculating a set of fitted parameter values using the set of sample data and the mathematical model; and including the set of fitted parameter values in the baseline model parameter value information.

16. The method of claim 13, further comprising:

including at least a capacitance, a resistance, and an inductance in the mathematical model;

associating the capacitance with the plasma processing chamber;

associating the resistance with a coupling mechanism, the coupling mechanism being coupled between the plasma processing chamber and a power generator; and associating the inductance with the coupling mechanism, wherein the set of electric model parameter values includes a value of the capacitance, a value of the resistance, and a value of the inductance.

17. The method of claim 16, further comprising:

determining that the plasma processing chamber is not ready for plasma processing when the value of the capacitance is outside a predetermined capacitance value range defined in the set of baseline model parameter value information;

indicating the plasma processing chamber as being problematic when the value of the capacitance is outside the predetermined capacitance value range; and indicating the coupling mechanism as being problematic when at least one of the value of the resistance and the value of the inductance is outside at least one predetermined parameter value range defined in the set of baseline model parameter value information.

\* \* \* \* \*

UNITED STATES PATENT AND TRADEMARK OFFICE
CERTIFICATE OF CORRECTION

PATENT NO. : 8,650,002 B2  
APPLICATION NO. : 12/499696  
DATED : February 11, 2014  
INVENTOR(S) : Brian Choi et al.

It is certified that error appears in the above-identified patent and that said Letters Patent is hereby corrected as shown below:

In the Specification:

Column 2, Line 29: Delete "is" and insert --in--

Column 5, Line 43: Delete "FIG. 18" and insert --FIG 1B--

Column 5, Line 63: After "denoted", insert --$L_{line}$,--

Column 6, Line 58: Delete "100" and insert --200--

In the Claims:

Column 13, Claim 1, Line 8: After "comparing;", delete "and"

Signed and Sealed this  
Twelfth Day of August, 2014

Michelle K. Lee  
*Deputy Director of the United States Patent and Trademark Office*